(12) United States Patent
Han

(10) Patent No.: US 12,284,432 B2
(45) Date of Patent: Apr. 22, 2025

(54) CAMERA MODULE

(71) Applicant: LG INNOTEK CO., LTD., Seoul (KR)

(72) Inventor: Sang Yeon Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 122 days.

(21) Appl. No.: 18/023,129

(22) PCT Filed: Aug. 26, 2021

(86) PCT No.: PCT/KR2021/011453
§ 371 (c)(1),
(2) Date: Feb. 24, 2023

(87) PCT Pub. No.: WO2022/045800
PCT Pub. Date: Mar. 3, 2022

(65) Prior Publication Data
US 2023/0300437 A1  Sep. 21, 2023

(30) Foreign Application Priority Data

Aug. 26, 2020  (KR) .................. 10-2020-0107743

(51) Int. Cl.
*H04N 23/54* (2023.01)
*G03B 30/00* (2021.01)
*H04N 23/52* (2023.01)

(52) U.S. Cl.
CPC ............ *H04N 23/54* (2023.01); *G03B 30/00* (2021.01); *H04N 23/52* (2023.01)

(58) Field of Classification Search
CPC ........ H04N 23/54; H04N 23/52; H04N 23/51; H04N 23/57; G03B 30/00; H01L 27/14625; H01L 27/14618; H01L 27/14609
See application file for complete search history.

(56) References Cited

U.S. PATENT DOCUMENTS

| 2009/0040368 | A1 | 2/2009 | Lin et al. |
| 2011/0267535 | A1* | 11/2011 | Seo ............... H01L 27/14618 348/374 |
| 2019/0174087 | A1* | 6/2019 | Kim ................. H04N 25/79 |
| 2021/0021744 | A1* | 1/2021 | Kim ................. G03B 17/02 |
| 2021/0281721 | A1 | 9/2021 | Momiuchi et al. |

FOREIGN PATENT DOCUMENTS

| CN | 209046735 U | 6/2019 |
| JP | 2010-205770 A | 9/2010 |
| KR | 10-2018-0051340 A | 5/2018 |
| KR | 10-1901709 B1 | 9/2018 |
| KR | 10-2019-0055084 A | 5/2019 |
| KR | 10-2019-0066196 A | 6/2019 |
| KR | 10-2019-0110226 A | 9/2019 |

* cited by examiner

*Primary Examiner* — Nhan T Tran
(74) *Attorney, Agent, or Firm* — Birch, Stewart, Kolasch & Birch, LLP

(57) ABSTRACT

A camera module according to an embodiment includes a circuit board including a cavity; a first plate including a first region vertically overlapping the cavity and a second region other than the first region; a second plate disposed on the first region of the first plate; and an image sensor disposed on the second plate; and wherein an upper surface of the second plate is positioned lower than an upper surface of the circuit board.

20 Claims, 9 Drawing Sheets

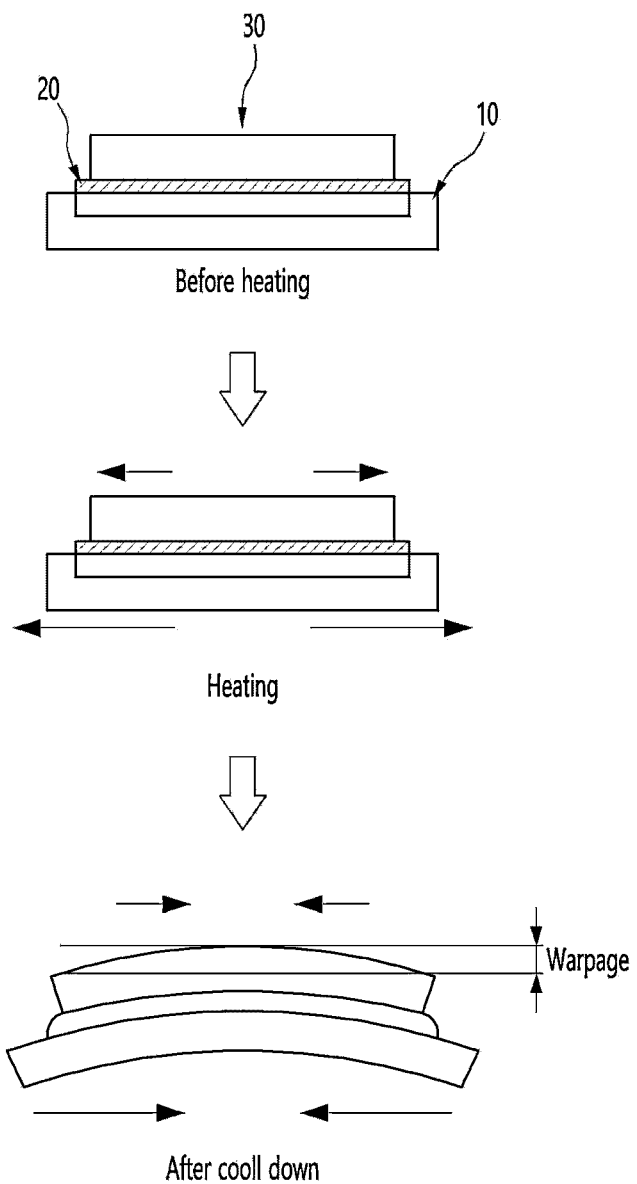

[FIG. 2]
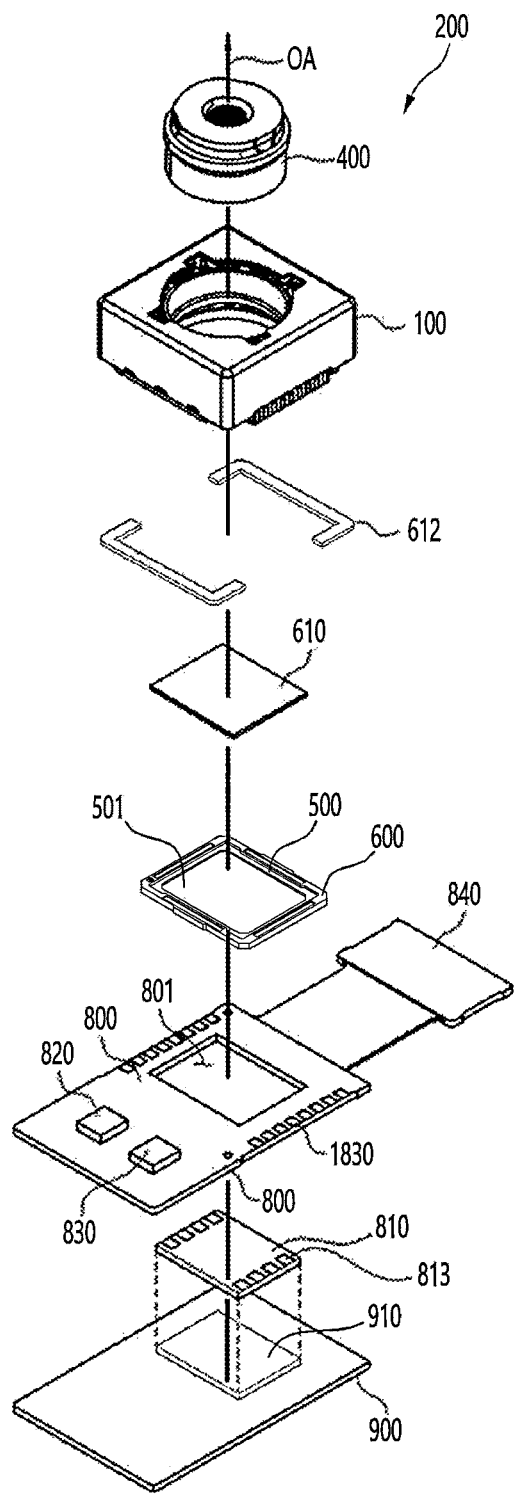

【FIG. 3】
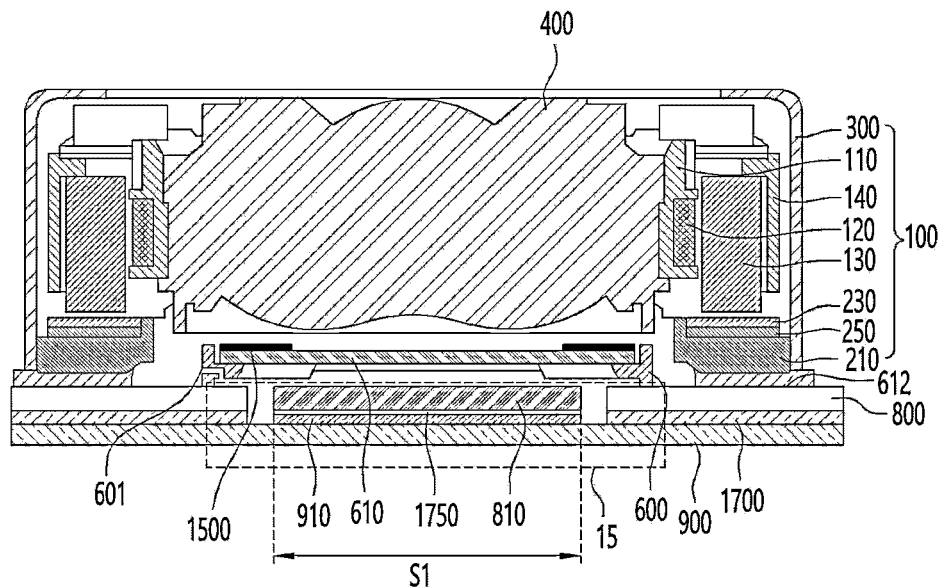
【FIG. 4】
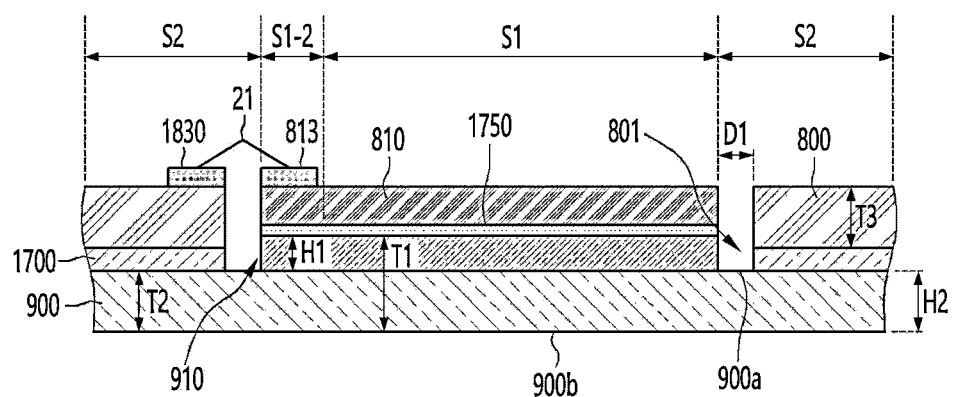

[FIG. 5]
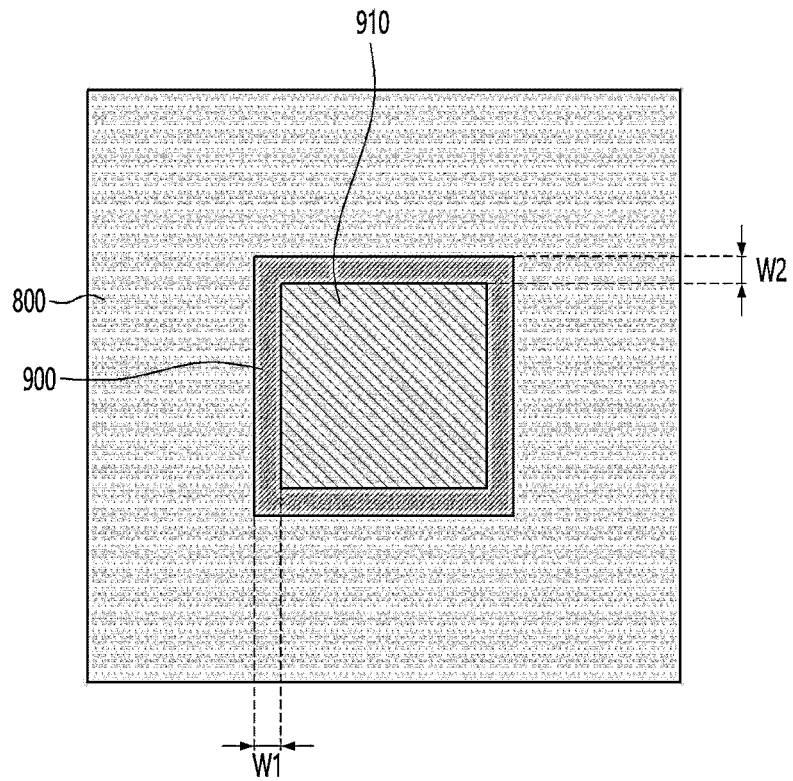
[FIG. 6]
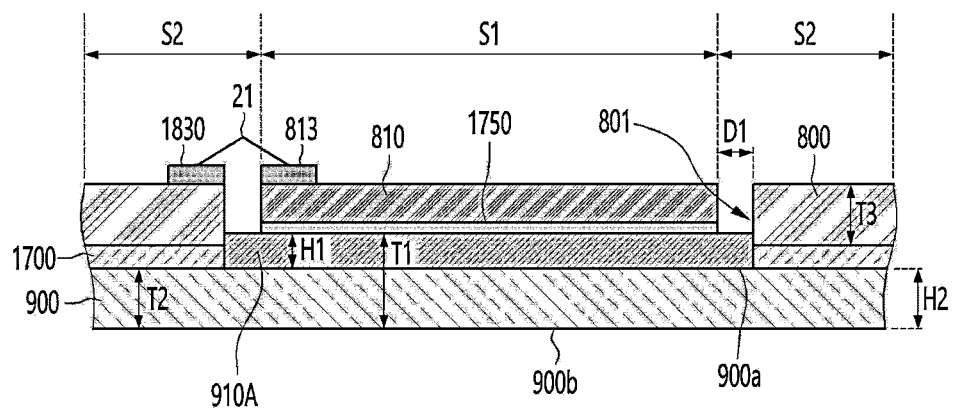

[FIG. 7]
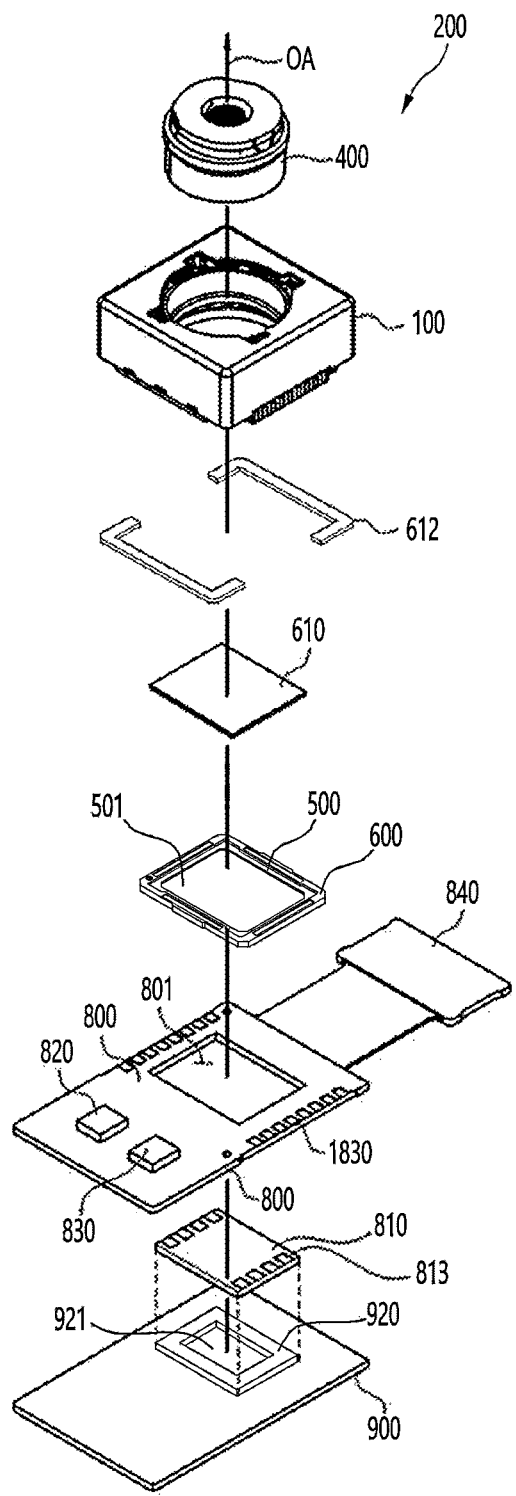

【FIG. 8】
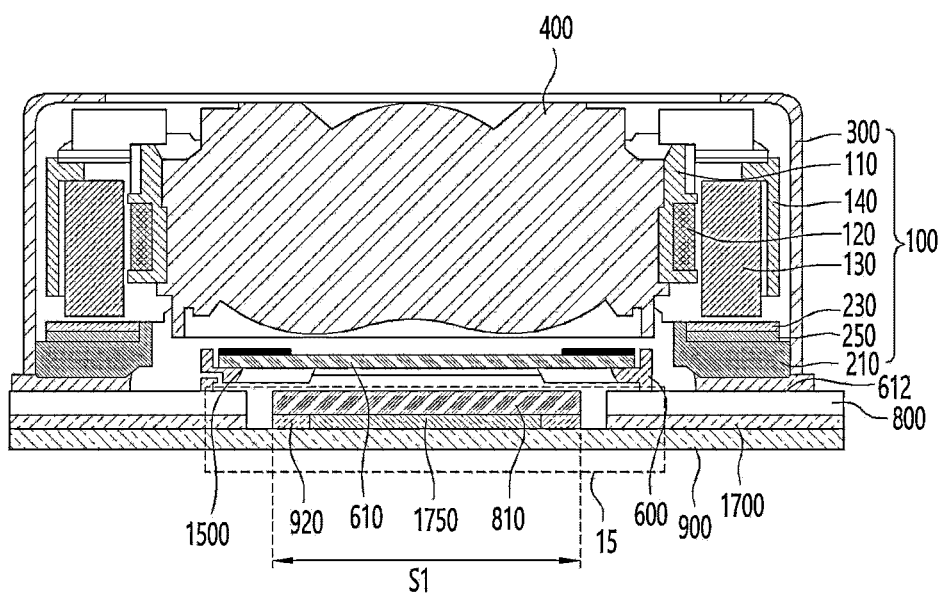
【FIG. 9】
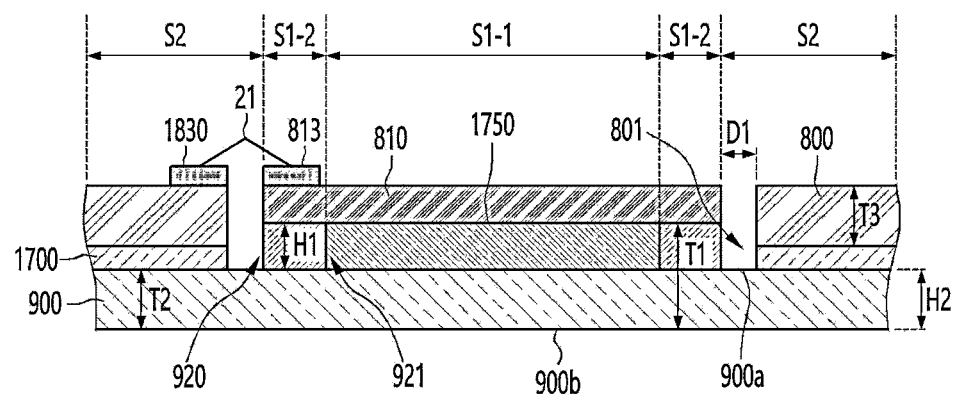

[FIG. 10]
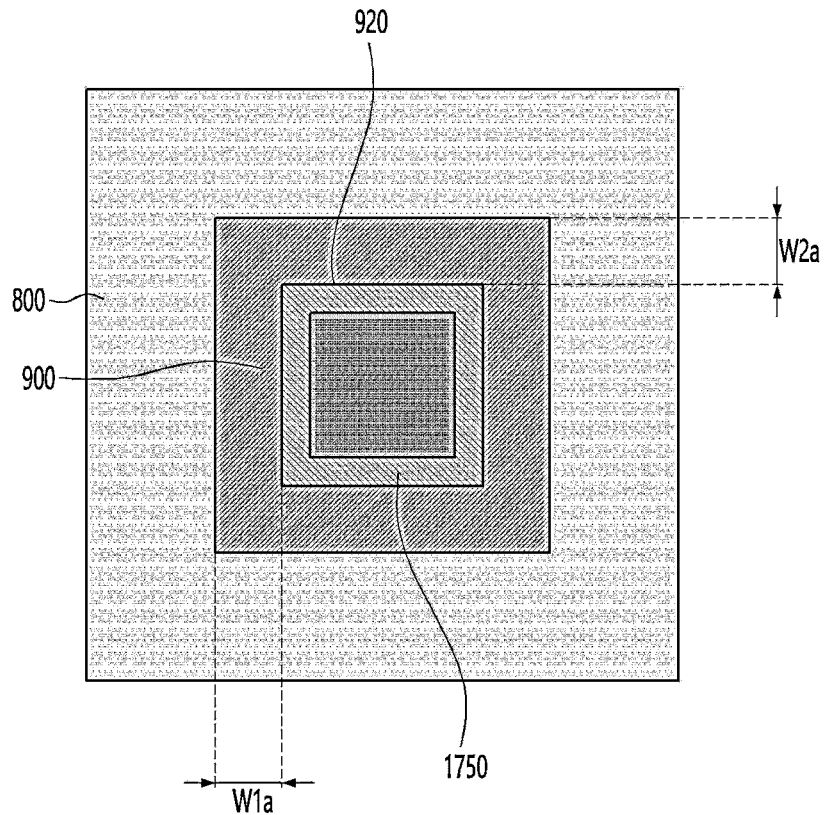
[FIG. 11]
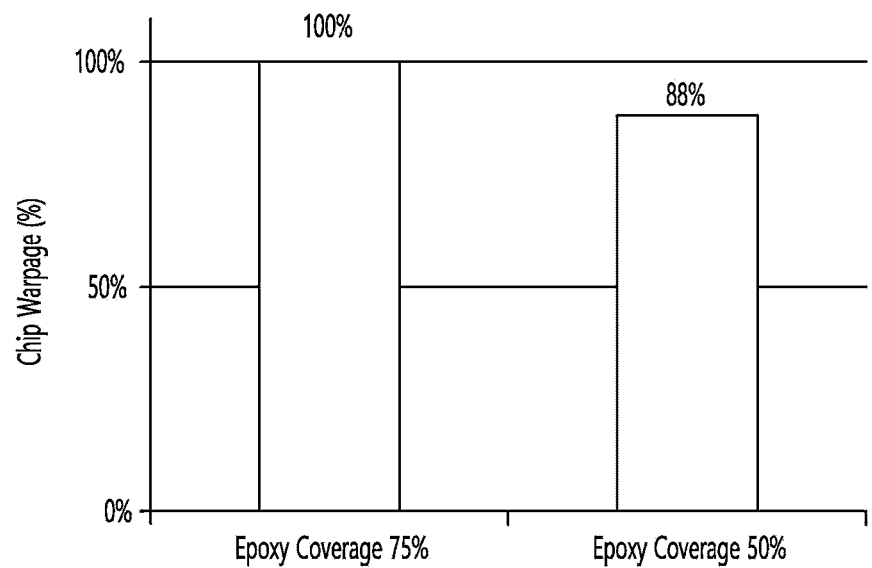

[FIG. 12]
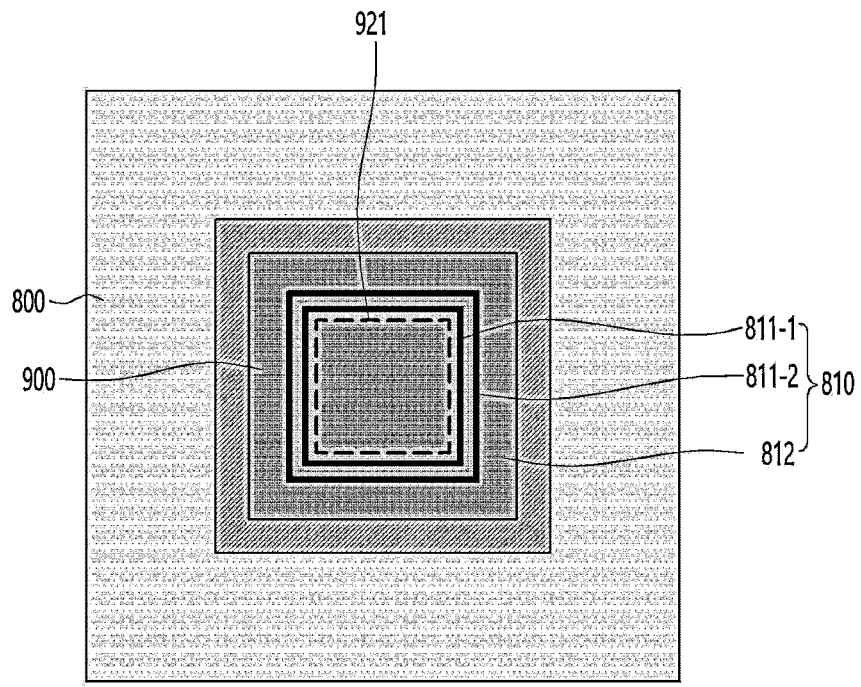
[FIG. 13]
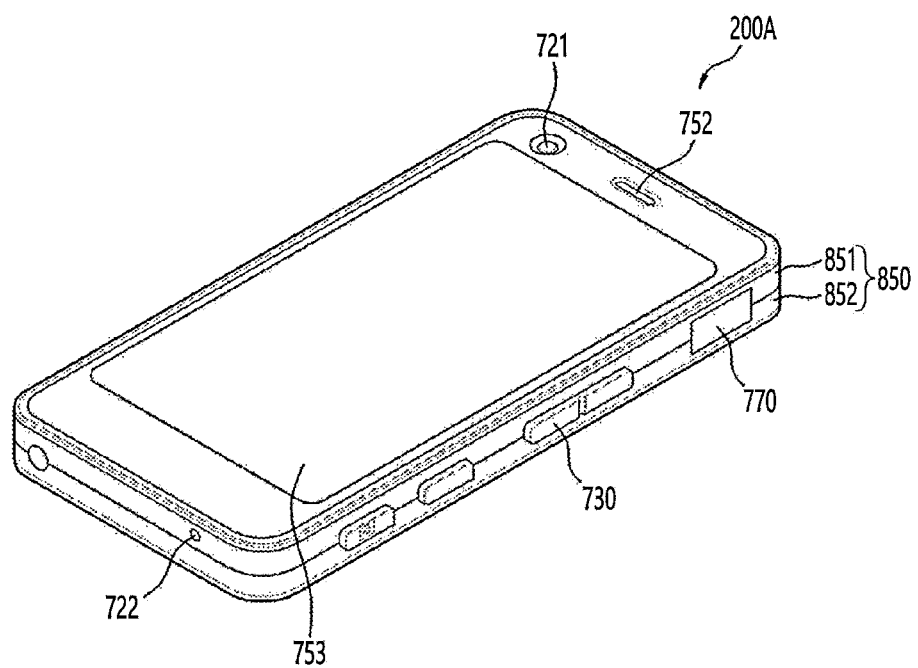

[FIG. 14]
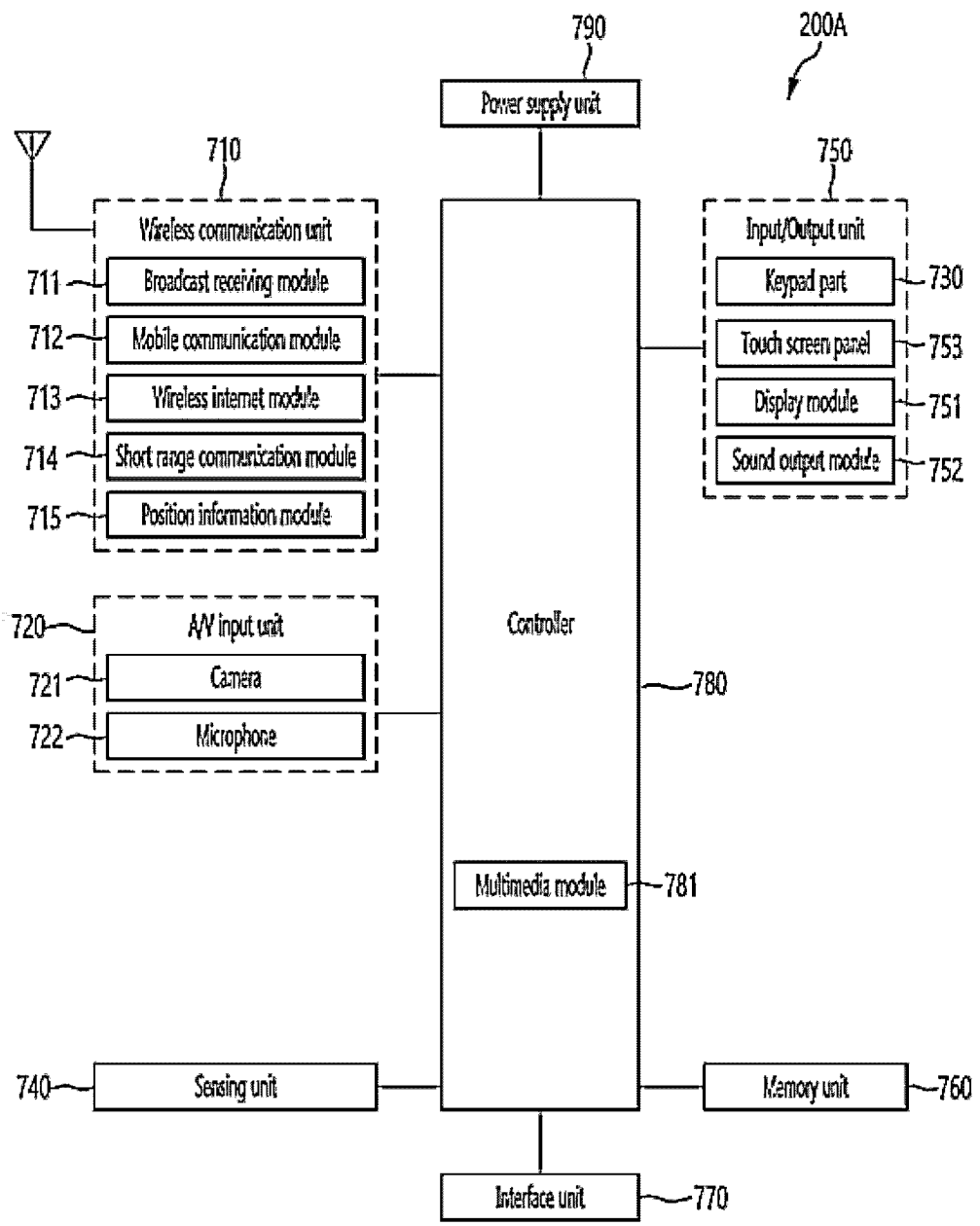

CAMERA MODULE

CROSS REFERENCE TO RELATED APPLICATIONS

This application is the National Phase of PCT International Application No. PCT/KR2021/011453, filed on Aug. 26, 2021, which claims priority under 35 U.S.C. 119(a) to Patent Application No. 10-2020-0107743, filed in the Republic of Korea on Aug. 26, 2020, all of which are hereby expressly incorporated by reference into the present application.

TECHNICAL FIELD

An embodiment relates to a camera module and an optical device including the same.

BACKGROUND ART

Recently, miniature camera modules have been developed, and the miniature camera modules are widely used in small electronic products such as smart phones, notebook computers, and game devices.

That is, most mobile electronic devices, including smartphones, are equipped with a camera device for obtaining an image from an object, and the mobile electronic devices are gradually becoming smaller for easy portability.

Such a camera device generally may include a lens through which light is incident, an image sensor that captures light incident through the lens, and a plurality of components for transmitting and receiving electrical signals for images obtained from the image sensor to an electronic device equipped with a camera device. In addition, these image sensors and components are generally mounted on a printed circuit board and connected to an external electronic device.

On the other hand, a conventional camera device uses a printed circuit board so that the image sensor is disposed at a high position. However, when the image sensor is directly mounted on the printed circuit board as described above, there is a problem in that heat generated from the image sensor is not dissipated, and thus there is a reliability problem due to heat generation. Recently, the pixels or size of image sensors are increasing for high resolution, and thus the heat problem of the image sensor further affects the performance of the camera device.

In addition, a printed circuit board in a conventional camera device is disposed on a plate such as a stiffener, and the image sensor is disposed on the plate, and then is connected to the printed circuit board through wire bonding. In this case, a cavity exposing a surface of the plate is formed in the printed circuit board. In this case, when the cavity type printed circuit board and the plate are used, the heat dissipation problem can be solved while increasing the height of the image sensor. In such a camera device, an epoxy for bonding an image sensor is applied on the plate, and the image sensor is disposed on the applied epoxy. However, the camera device as described above has a problem in that warpage occurs due to a difference between a coefficient of thermal expansion of the image sensor, a coefficient of thermal expansion of the printed circuit board, and a coefficient of thermal expansion of the epoxy. For example, a thermal curing process proceeds in a state in which an image sensor is disposed on the epoxy. In this case, when the thermal curing process proceeds, the configuration including the plate, the epoxy and the image sensor is heat-expanded and then contracted, and accordingly, there is a problem that the warpage phenomenon occurs severely in a shape like TT. In addition, when the warpage phenomenon of the image sensor occurs, there is a problem in that the resolution performance of the camera device is deteriorated, and thus the yield of the camera device is decreased.

Accordingly, there is a need for a method capable of minimizing the warpage of the image sensor.

DISCLOSURE

Technical Problem

An embodiment is to provide a camera module capable of minimizing the warpage phenomenon of an image sensor and an optical device including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A camera module according to an embodiment comprises a circuit board including a cavity; a first plate including a first region vertically overlapping the cavity and a second region other than the first region; a second plate disposed on the first region of the first plate; and an image sensor disposed on the second plate; wherein an upper surface of the second plate is positioned lower than an upper surface of the circuit board.

In addition, the camera module further comprises a first adhesive member disposed between the first plate and the image sensor.

In addition, the first region of the first plate includes: a first-first region where the first adhesive member is disposed; and a first-second region in which the second plate is disposed; and wherein the second plate includes an opening vertically overlapping the first-first region.

In addition, a lower surface of the image sensor includes a first portion directly contacting the first adhesive member and a second portion directly contacting the second plate.

In addition, the upper surface of the second plate is positioned on the same plane as an upper surface of the first adhesive member.

In addition, an area of an upper surface of the first adhesive member is smaller than an area of a lower surface of the image sensor.

In addition, the second plate vertically overlaps an outer region of a lower surface of the image sensor.

In addition, an outer side surface of the second plate is spaced apart from an inner wall of the cavity of the circuit board.

In addition, an outer side surface of the second plate directly contacts an inner wall of the cavity of the circuit board.

In addition, the image sensor includes a pixel region including an active pixel region and a dummy pixel region, and a passivation region around the dummy pixel region; and wherein the upper surface of the second plate vertically overlaps a corner region of a lower surface of the active pixel region.

In addition, the camera module further comprises a second adhesive member disposed between the second region of the first plate and the circuit board, wherein the second adhesive member includes an opening vertically overlapping the cavity of the circuit board.

In addition, the circuit board includes a first terminal, the image sensor includes a second terminal, and wherein the camera module further comprises a wire connecting the first terminal and the second terminal.

In addition, the camera module further comprises a lens barrel; a holder disposed on the circuit board and including a seating part on which a filter is seated; and a cover member disposed on the circuit board and accommodating the holder and the lens barrel.

In addition, the holder includes a gas vent hole penetrating the inner and outer surfaces.

On the other hand, an optical device according to an embodiment comprises a lens barrel; a holder disposed below the lens barrel; a filter disposed in the holder; a cover member accommodating the lens barrel, the holder, and the filter; a circuit board including a cavity and having the holder and the cover member disposed on an upper surface thereof; a first plate including a first region vertically overlapping the cavity and a second region other than the first region; a second plate disposed on the first region of the first plate; and an image sensor disposed on the second plate; wherein the first region of the first plate includes a first-first region; and Including a first-second region other than the first-first region vertically overlapping the second plate, the second plate includes an opening vertically overlapping the first-first region, wherein a first adhesive member is disposed in the opening, and a lower surface of the image sensor includes a first portion directly contacting the first adhesive member and a second portion directly contacting the second plate.

Effects of the Invention

An embodiment includes a first plate and a second plate. The second plate is disposed on a first region of the first plate vertically overlapping a cavity of a circuit board. In addition, the image sensor is attached or fixed on the second plate. In this case, the second plate includes an opening in which an adhesive member for attaching the image sensor is disposed. That is, the adhesive member may be disposed on a region of an upper surface of the first plate that vertically overlaps the opening of the second plate. In addition, the image sensor may be attached or fixed to the first plate by the adhesive member in a state in which at least a part of a lower surface of the image sensor of the embodiment is in direct contact with an upper surface of the second plate. According to the embodiment, at least a part of the image sensor directly contacts the second plate, thereby minimizing the warpage phenomenon of the image sensor. In addition, heat generated from the image sensor may be efficiently dissipated to an outside by directly contacting at least a part of the image sensor with the second plate.

In addition, an area of an adhesive member disposed on a lower surface of the image sensor in the embodiment is smaller than an area of a lower surface of the image sensor. Accordingly, an arrangement area of the adhesive member in the embodiment is reduced compared to the area of the image sensor, and accordingly, the warpage phenomenon of the image sensor, which increases in proportion to the area of the adhesive member, can be minimized.

In addition, the embodiment allows direct contact between a corner region of a lower surface of an active pixel region of the image sensor and an upper surface of the second plate. For example, at least a part of the active pixel region of the image sensor vertically overlaps the second plate. Accordingly, the embodiment can solve the warpage problem of the active pixel region of the image sensor, thereby improving the operation reliability of the camera module.

DESCRIPTION OF DRAWINGS

FIG. 1 is a view for explaining a warpage phenomenon of a camera module of a comparative example.

FIG. 2 is an exploded perspective view of a camera module according to a first embodiment.

FIG. 3 is a cross-sectional view of a camera module of FIG. 2 according to an embodiment.

FIG. 4 is an enlarged view of a dotted line portion of FIG. 3.

FIG. 5 is a plan view showing a circuit board, a first plate, and a second plate in a state in which an image sensor is removed according to a first embodiment.

FIG. 6 is a cross-sectional view according to an embodiment of the camera module of FIG. 2 according to a second embodiment.

FIG. 7 is an exploded perspective view of a camera module according to a third embodiment.

FIG. 8 is a cross-sectional view of the camera module of FIG. 7 according to an embodiment.

FIG. 9 is an enlarged view of a dotted line portion of FIG. 8.

FIG. 10 is a plan view showing a circuit board, a plate, and a first adhesive member in a state in which an image sensor is removed according to a third embodiment.

FIG. 11 is a view showing a degree of warpage according to an arrangement area of an adhesive member.

FIG. 12 is a view for explaining a disposition relationship between a protruding part of a plate and an image sensor according to a third embodiment.

FIG. 13 is a perspective view of a portable terminal according to an embodiment.

FIG. 14 is a block diagram of the portable terminal shown in FIG. 13.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

An optical axis direction used below is defined as an optical axis direction of a camera actuator and a lens coupled to a camera module, and a vertical direction may be defined as a direction perpendicular to the optical axis.

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor.

Meanwhile, "auto focus" may correspond to "AF (Auto Focus)". In addition, a closed-loop auto focus (CLAF) control may be defined as real-time feedback control of the lens position by sensing the distance between the image sensor and the lens to improve focus adjustment accuracy.

In addition, before a description of an embodiment of the present invention, a first direction may mean a x-axis direction shown in drawings, and a second direction may be a different direction from the first direction. For example, the second direction may mean a y-axis direction shown in the drawing in a direction perpendicular to the first direction. Also, a third direction may be different from the first and second directions. For example, the third direction may mean a z-axis direction shown in the drawing in a direction perpendicular to the first and second directions. Here, the third direction may mean an optical axis direction.

Hereinafter, a structure in a comparative example and problems thereof will be described before describing embodiments of the present application.

FIG. 1 is a view for explaining a warpage phenomenon of a camera module of a comparative example.

Referring to FIG. 1, the camera module of a comparative example has a structure including a plate 10, an adhesive member 20 and an image sensor 30. The image sensor 30 is a sensor die constituting a sensor chip, and may generally be a silicon (Si) die.

In this case, the plate 10, the adhesive member 20 and the image sensor 30 (specifically, the silicon die) have different coefficients of thermal expansion (CTE). Here, the coefficient of thermal expansion means a change in length by a unit*temperature change for a unit*length.

The camera module of the comparative example as described above proceeds with a thermal curing process in a state in which the image sensor 30 is disposed on the plate 10 using the adhesive member 20. In addition, the image sensor 30 is attached or fixed on the plate 10 by the thermal curing process.

In this case, referring to a first view of FIG. 1, it can be seen that warpage does not occur when the plate 10, the adhesive member 20, and the image sensor 30 are sequentially stacked before heating.

In addition, referring to a second view of FIG. 1, when heat is applied to proceed with the thermal curing process, both ends of each of the plate 10, the adhesive member 20, and the image sensor 30 are expand in a longitudinal direction away from each other.

And, referring to a third view of FIG. 1, when the thermal curing process is completed and the cooling process proceeds (after cool down), each of the expanded plate 10, the adhesive member 20 and the image sensor 30 is contracted to a state before expansion.

In this case, the plate 10, the adhesive member 20 and the image sensor 30 have different coefficients of thermal expansion. The coefficient of thermal expansion of each component is shown in Table 1 below.

TABLE 1

| Material | CTE $((10 - 6 \text{ m}/(\text{m}° \text{C.}))$ |
|---|---|
| Silicon (image sensor die) | 3~5 |
| Epoxy (adhesive member) | 45~65 |
| Copper Alloys (plate) | 17.6 |

As described above, the plate 10, the adhesive member 20 and the image sensor 30 have different coefficients of thermal expansion. Accordingly, when the expansion and contraction according to the thermal curing proceed, a difference occurs in the degree of contraction due to the difference in the coefficient of thermal expansion, and accordingly, a warpage occurs in a shape of '∩'.

In addition, when the warpage phenomenon of the image sensor occurs, there is a problem in that the resolution performance of the camera device is deteriorated, and thus the yield of the camera device is decreased.

Accordingly, the embodiment minimizes the warpage that occurs due to the difference in the coefficient of thermal expansion between the plate 10, the image sensor 30 and the adhesive member 20, and accordingly, it is possible to improve the performance of the camera device.

FIG. 2 is an exploded perspective view of a camera module according to a first embodiment, FIG. 3 is a cross-sectional view of the camera module of FIG. 2 according to an embodiment, and FIG. 4 is an enlarged view of the dotted line portion of FIG. 3.

Referring to FIGS. 2 to 4, the camera module 200 may include a lens or lens barrel 400, a lens driving device 100, a filter 610, a holder 600, a circuit board 800, a plate 900 and an image sensor 810. Here, "camera module" may be expressed by replacing "capturing device" or "photographer", and the holder 600 may be expressed by replacing "filter base" or "inner base".

In addition, the camera module 200 may further include a blocking member 1500 disposed on the filter 610.

In addition, the camera module 300 may further include a third adhesive member 612.

In addition, the camera module 300 may further include a motion sensor 820, a control unit 830, and a connector 840.

A lens or a lens barrel 400 may be mounted on a bobbin 110 of the lens driving device 100.

The lens driving device 100 may drive a lens or a lens barrel 400

The camera module 200 may be any one of a camera module for Auto Focus (AF) and a camera module for Optical Image Stabilizer (OIS). A camera module for AF refers to a thing capable of performing only an autofocus function, and an OIS camera module refers to a thing capable of performing an autofocus function and an OIS (Optical Image Stabilizer) function.

For example, the lens driving device 100 may be a lens driving device for AF or a lens driving device for OIS, and here, the meanings of "for AF" and "for OIS" may be the same as those described in the camera module for AF and the camera module for OIS.

For example, the lens driving device 100 of the camera module 200 may be a lens driving device for OIS.

The lens driving device 100 may include a housing 140, a bobbin 110 disposed in the housing 140 and for mounting a lens or lens barrel 400, a first coil 120 disposed on the bobbin 110, a magnet 130 disposed in the housing 140 and facing the first coil 120, at least one upper elastic member (not shown) coupled to an upper portion of the bobbin 110 and an upper portion of the housing 140, at least one lower elastic member (not shown) coupled to a lower portion of the bobbin 110 and a lower portion of the housing 140, a second coil 230 disposed under the bobbin 110 (or/and housing 140), a driving board 250 disposed under the second coil 230, and a base 210 disposed under the driving board 250.

In addition, the lens driving device 100 may further includes a cover member 300 coupled to the base 210 and providing a space for accommodating components of the lens driving device 100 together with the base 210.

In addition, the lens driving device 100 may further include a support member (not shown) that electrically connects the driving board 250 and the upper elastic member and supports the housing 140 with respect to the base 210. Each of the first coil 120 and the second coil 230 may be electrically connected to the driving board 250 and receive a driving signal (driving current) from the driving board 250.

For example, the upper elastic member may include a plurality of upper springs, and the support member may include support members connected to the upper springs, and the first coil 120 may be electrically connected to the driving board 250 through the upper springs and the support member. The driving board 250 may include a plurality of terminals, and a part of the plurality of terminals may be electrically connected to each of the first coil 120 and/or the second coil 230.

The bobbin 110 and the lens or lens barrel 400 coupled thereto may be moved in the optical axis direction by the electromagnetic force due to the interaction between the first coil 120 and the magnet 130, as a result, a displacement of the bobbin 110 is controlled in the optical axis direction, so that AF driving can be implemented.

In addition, the housing 140 may be moved in a direction perpendicular to the optical axis by the electromagnetic force due to the interaction between the second coil 230 and the magnet 130, as a result, image stabilization or OIS driving may be implemented.

In addition, the lens driving device 100 of the camera module 200 may further include a sensing magnet (not shown) disposed on the bobbin 110 and an AF position sensor (eg, a hall sensor, not shown) disposed on the housing 140 for AF feedback driving. In addition, the lens driving device 100 may further include a circuit board (not shown) disposed on the housing and/or the base and on which the AF position sensor is disposed or mounted. In another embodiment, the AF position sensor may be disposed on the bobbin, and the sensing magnet may be disposed on the housing. In addition, the lens driving device 100 may further include a balancing magnet disposed on the bobbin 110 to correspond to the sensing magnet.

The AF position sensor may output an output signal according to a result of detecting a strength of a magnetic field of the sensing magnet according to a movement of the bobbin 100. The AF position sensor may be electrically connected to the driving board 250 through the upper elastic member (or lower elastic member) and/or the supporting member. The driving board 250 may provide a driving signal to the AF position sensor, and an output of the AF position sensor may be transmitted to the driving board 250.

In another embodiment, the lens driving device 100 may be a lens driving device for AF, and the AF lens driving device may include a housing, a bobbin disposed inside the housing, a coil disposed on the bobbin, a magnet disposed on the housing, at least one elastic member coupled to the bobbin and the housing, and a base disposed under the bobbin (or/and the housing).

For example, the elastic member may include the above-described upper elastic member and the lower elastic member.

A driving signal (eg, a driving current) may be provided to the coil, and the bobbin may be moved in the optical axis direction by electromagnetic force due to the interaction between the coil and the magnet.

In another embodiment, the coil may be disposed on the housing, and the magnet may be disposed on the bobbin.

In addition, the lens driving device for AF for AF feedback driving may further include a sensing magnet disposed on the bobbin, an AF position sensor (eg, a hall sensor) disposed on the housing, a circuit board disposed or mounted on the housing and/or the base, and a circuit board on which the AF position sensor is disposed and disposed or mounted to the housing and/or base. In another embodiment, the AF position sensor may be disposed on the bobbin, and the sensing magnet may be disposed on the housing.

The camera module according to another embodiment may include a housing coupled to a lens or a lens barrel 400 instead of the lens driving device 100 of FIG. 2 and fixing the lens or the lens barrel 400. The housing may be coupled or attached to an upper surface of a holder 600. The housing attached or fixed to the holder 600 may not be moved, and the position of the housing may be fixed while being attached to the holder 600.

The circuit board may be electrically connected to the coil and the AF position sensor, a driving signal may be provided to each of the coil and the AF position sensor through the circuit board, and the output of the AF position sensor may be transmitted to the circuit board.

The holder 600 may be disposed under a base 210 of the lens driving device 100.

The filter 610 is mounted on the holder 600, and the holder 600 may include a seating part 500 on which the filter 610 is seated.

An adhesive member 612 may couple or attach the base 210 of the lens driving device 100 to the holder 600. For example, a third adhesive member 612 may be disposed between a lower surface of the base 210 and an upper surface of the holder 600, and may adhere them to each other.

The third adhesive member 612 may serve to prevent foreign substances from being introduced into the lens driving device 100 in addition to the above-described adhesive role. For example, the third adhesive member 612 may be an epoxy, a thermosetting adhesive, or an ultraviolet curable adhesive. The third adhesive member 612 may directly contact a cover member 300 according to the embodiment. The third adhesive member 612 may be an adhesive member for coupling the cover member 300 to the circuit board 800 described below.

The filter 610 may be disposed in the seating part 500 of the holder 600.

The seating part 500 of the holder 600 may include a protrusion (not shown) protruding from an upper surface of the holder 600, but is not limited thereto. In another embodiment, the seating part may be in the form of a recess, a cavity, or a hole concaved from the upper surface of the holder 600.

The protrusion of the seating part 500 may serve to prevent a lower end of the lens or the lens barrel 400 from contacting or colliding with the filter 610 (or/and the blocking member 1500).

The protrusion of the seating part 500 may be formed to protrude along the side surface of the filter 610 in the optical axis direction. For example, the protrusion may be disposed around the side surface of the filter 610 to surround the side surface of the filter 610.

An inner surface of the protrusion may be provided to face the side surface of the filter 610, and they may be spaced apart from each other. This is to secure a processing tolerance for easily mounting the filter 610 inside the seating part 500 of the holder 600.

In addition, an upper surface of the protrusion of the seating part 500 may be located higher than the upper surface of the filter 610 in the optical axis direction. This is to prevent the lens or the lower end of the lens barrel 400 from directly colliding with the filter 610 when the lens or the lens barrel 400 is mounted on the lens driving device 100 and moves in the optical axis direction or moves in the direction toward the filter 610 by an external impact.

A shape of the protrusion of the seating part 500 viewed from the upper side may match a shape of the filter 610, but is not limited thereto. In another embodiment, a shape of the protrusion of the seating part 500 may be similar to or different from the shape of the filter 610.

The holder 600 may include an opening 501 formed at a portion where the filter 610 is mounted or disposed so that light passing through the filter 610 may be incident on the image sensor 810.

For example, the opening 501 may pass through the holder 600 in the optical axis direction, and may be expressed by replacing "through hole".

For example, the opening 501 may pass through a center of the holder 600 and may be provided in the seating part 500. In addition, an area of the opening 501 may be smaller than an area of the filter 610.

The holder 600 may include a gas vent hole 601. The gas vent hole 601 may be a communication hole communicating an inside of the holder 600 and an outside of the holder 600. Specifically, the holder 600 is accommodated in the accommodation space of the cover member 300 and includes a filter arrangement space in which the filter 610 is disposed.

In addition, the gas vent hole 601 may communicate a filter arrangement space of the holder 600 and an accommodation space of the cover member 300. The holder 600 is attached to the circuit board 800 through an adhesive member (not shown). In addition, the filter 610 is attached to the holder 600 through an adhesive member (not shown). In addition, in a state in which the filter 610 is attached to the holder 600, gas generated during a forming process of the adhesive member (not shown) may exist in the inner space of the holder 600. In addition, the gas may affect the reliability of the filter 610 attached to the holder 600 and may further affect the overall performance of the camera module. Therefore, in the embodiment, the gas vent hole 601 is formed in the holder 600 so that the gas existing in the inner space of the holder 600 can be discharged to the outside.

For example, the filter 610 may be disposed in the seating part 500 of the holder 600.

The filter 610 may serve to block light of a specific frequency band in light passing through the lens barrel 400 from entering the image sensor 810.

For example, the filter 610 may be an infrared cut filter, but is not limited thereto. For example, the filter 610 may be disposed to be parallel to an x-y plane perpendicular to the optical axis OA.

The filter 610 may be attached to the seating part 500 of the holder 600 by an adhesive member (not shown) such as UV epoxy.

The circuit board 800 may be disposed under the holder 600, and the holder 600 may be disposed on the upper surface of the circuit board 800.

The holder 600 may be attached to or fixed to the upper surface of the circuit board 800 by an adhesive member such as an epoxy, a thermosetting adhesive, or an ultraviolet curable adhesive. In this case, the adhesive member may be disposed between the lower surface of the holder 600 and the upper surface of the circuit board 800.

In addition, the third adhesive member 612 may be disposed between the circuit board 800 and the cover member 300.

In other words, the embodiment allows the cover member 300 to be attached or fixed to the circuit board 800 separately from the holder 600 without being disposed on the holder 600.

Accordingly, the embodiment can reduce an overall thickness of the camera module by an amount corresponding to a height of the holder 600, thereby achieving slimming of the camera module.

The circuit board 800 may have a cavity 801 corresponding to an opening 501 of the holder 600. The cavity 801 of the circuit board 800 may be in the form of a through hole passing through the circuit board 800 in an optical axis direction. For example, the circuit board 800 may include a cavity 801 vertically overlapping the opening 501 of the holder 600. In this case, the vertical may correspond to the optical axis.

An image sensor 810 may be disposed in the cavity 801 of the circuit board 800.

A first plate 900 may be disposed below the circuit board 800.

In addition, the second plate 910 may be disposed on the first plate 900. Preferably, the second plate 910 may be disposed in a region of the upper surface of the first plate 900 vertically overlapping the cavity 801 of the circuit board 800. Accordingly, the second plate 910 may vertically overlap the cavity 801 of the circuit board 800.

An area of the second plate 910 may be smaller than that of the first plate 900.

The first plate 900 and the second plate 910 are separate plates separated from each other. An adhesive member (not shown) may be provided between the first plate 900 and the second plate 910. In addition, the second plate 910 may be attached and/or fixed to the upper surface of the first plate 900 through the adhesive member (not shown).

The second plate 910 may be a mounting part in which the image sensor 810 is mounted.

The second plate 910 may protrude from one region of the upper surface of the first plate 900 in an optical axis direction or a vertical direction.

The image sensor 810 is disposed on the upper surface of the second plate 910. Accordingly, the image sensor 810 may overlap the cavity 801 of the circuit board 800 in an optical axis direction or a vertical direction.

The image sensor 810 disposed on the second plate 910 may be electrically connected to the circuit board 800 through a wire 21. For example, the wire 21 may connect a terminal 813 of the image sensor 810 and a terminal 1830 of the circuit board 800 to each other.

The first plate 900 and the second plate 910 are plate-like members having a predetermined thickness and hardness. The first plate 900 and the second plate 910 may also be referred to as 'reinforcing plates'. The first plate 900 and the second plate 910 may also be referred to as 'heat dissipation plates'. The first plate 900 and the second plate 910 may also be referred to as 'support plates'.

That is, the first plate 900 and the second plate 910 can stably support the image sensor 810 and it is function to prevent the image sensor from being damaged due to an external impact or contact. Accordingly, the embodiment may improve physical reliability and electrical reliability of the image sensor 810.

In addition, the first plate 900 and the second plate 910 may perform a heat dissipation function of dissipating heat generated from the image sensor 810 to an outside. Accordingly, the embodiment may improve heat dissipation properties of the image sensor 810.

For example, at least one of the first plate 900 and the second plate 910 may be formed of a metal material having high thermal conductivity, such as SUS or aluminum, but is not limited thereto. In another embodiment, at least one of the first plate 900 and the second plate 910 may be formed of glass epoxy, plastic, or synthetic resin.

In addition, the first plate 900 may serve as a ground to protect the camera module from electrostatic discharge protection (ESD) by being electrically connected to a ground terminal of the circuit board 800.

The image sensor 810 may be a portion on which the light passing through the filter 610 is incident to form an image included in the light.

The circuit board 800 may be provided with various circuits, elements, control units, etc. in order to convert an image formed on the image sensor 810 into an electrical signal and transmit it to an external device. A circuit pattern electrically connected to an image sensor and various devices may be formed on the circuit board 800.

The holder 600 may be represented by replacing a first holder, and the circuit board 800 may be represented by replacing a second holder.

The image sensor 810 may receive an image included in light incident through the lens driving device 100 and convert the received image into an electrical signal.

The filter 610 and the image sensor 810 may be spaced apart to face each other in the optical axis OA direction or a first direction or a vertical direction.

The blocking member 1500 may be disposed on the upper surface of the filter 610. The blocking member 1500 may be replaced with a "masking unit".

For example, the blocking member 1500 may be disposed on a corner region of the upper surface of the filter 610, and serve to block at least a portion of light incident toward the corner region of the filter 610 through the lens or lens barrel 400 from passing through the filter 610. For example, the blocking member 1500 may be coupled or attached to the upper surface of the filter 610.

For example, the filter 610 may be formed in a rectangular shape viewed in the optical axis direction, and the blocking member 1500 may be formed symmetrically with respect to the filter 610 along each side of the upper surface of the filter 610.

In this case, the blocking member 1500 may be formed to have a constant width at each side of the upper surface of the filter 1610.

The blocking member 1500 may be formed of an opaque material. For example, the blocking member 1500 may be provided in the form of an opaque adhesive material applied to the filter 610 or in the form of a film attached to the filter 610.

The filter 610 and the image sensor 810 may be disposed to face each other in the optical axis direction, and the blocking member 1500 may at least partially overlap the terminal 1830 and/or the wire 21 disposed on the circuit board 800 in the optical axis direction.

The wire 21 and the terminal 1830 may be formed of a conductive material, for example, gold (Au), silver (Ag), copper (Cu), a copper alloy, etc., and such a conductive material may have a property of reflecting light. The light passing through the filter 610 may be reflected by the terminal 1830 and the wire 21 of the circuit board 800, and an instantaneous flashing, that is, a flare phenomenon may occur by this reflected light, and such a flare phenomenon may distort an image formed on the image sensor 810 or deteriorate image quality.

The blocking member 1500 is disposed so that at least a portion overlaps with the terminal 1830 and/or the wire 21 in the optical axis direction, thereby, it is possible to block the light directed to the terminal 1830 of the circuit board 800, and/or the wire 21 among the light passing through the lens or the lens barrel 400, thereby preventing the flare phenomenon from occurring, and accordingly, it is possible to prevent the image formed on the image sensor 810 from being distorted or from deterioration of image quality.

A motion sensor 820 may be mounted or disposed on the circuit board 800, and may be electrically connected to the controller 830 through a circuit pattern provided on the circuit board 800.

The motion sensor 820 outputs rotational angular velocity information by the movement of the camera module 200. The motion sensor 820 may be implemented as a 2-axis or 3-axis gyro sensor or an angular velocity sensor.

A control unit 830 is mounted or disposed on the circuit board 800.

The circuit board 800 may be electrically connected to the lens driving device 100. For example, the circuit board 800 may be electrically connected to the driving board 250 of the lens driving device 100.

For example, a driving signal may be provided to each of the first coil 120 and the second coil 230 of the lens driving device 100 through the circuit board 800, and a drive signal may be provided to the AF position sensor (or OIS position sensor). Also, the output of the AF position sensor (or OIS position sensor) may be transmitted to the circuit board 800.

The connector 840 is electrically connected to the circuit board 800, and may include a port for electrically connecting to an external device.

In the first embodiment, a first adhesive member 1750 may be disposed between the lower surface of the image sensor 810 and the upper surface of the second plate 910, and the image sensor 810 may be attached or fixed to the second plate 910 by the first adhesive member 1750. The first adhesive member 1750 may be an epoxy, a thermosetting adhesive, an ultraviolet curable adhesive, or an adhesive film, but is not limited thereto.

For example, the image sensor 810, the first adhesive member 1750, and the second plate 910 of the first embodiment may overlap each other in an optical axis direction or a vertical direction.

In the first embodiment, an area of the second plate 910 may be the same as that of a lower surface of the image sensor 810. In addition, an area of the first adhesive member 1750 disposed on the second plate 910 may be the same as an area of a lower surface of the image sensor 810. For example, an edge of a lower surface of the image sensor 810 may be positioned on the same vertical line as an edge of an upper surface of the second plate 910.

For example, the first plate 900 includes a first region S1 vertically overlapping the image sensor 810. The first region S1 of the first plate 900 may vertically overlap the cavity 801 of the circuit board 800. In addition, the first plate 900 may include a second region S2 other than the first region S1. The second region S2 of the first plate 900 may vertically overlap the circuit board 800.

The first region S1 of the first plate 900 may be a region where the second plate 910 is disposed. In addition, the second region S2 of the first plate 900 may be a region where the circuit board 800 is disposed.

In addition, a ratio (H1:H2) of a first height H1 from the upper surface 900a of the first plate 900 to the upper surface of the second plate 910 and a second height H2 from the lower surface 900b of the first plate 900 to the upper surface 900a of the first plate 900 may be 1:0.67 to 1:2.1.

When a value obtained by dividing the second height H2 by the first height H1 (H2/H1) is less than 0.67, the first plate 900 is easily bent or deformed to the extent that it cannot stably support the circuit board 800.

In addition, when a value obtained by dividing the second height by the first height (H2/H1) exceeds 2.1, the height of the second plate 910 is insufficient, so that a flatness of the first plate 900 and further a flatness of the image sensor 810 may deteriorate. In addition, when a value obtained by dividing the second height by the first height (H2/H1) exceeds 2.1, reliability of wire bonding may deteriorate because a step in the optical axis direction between the upper surface of the image sensor 810 and the upper surface of the circuit board 800 increases.

Accordingly, in the embodiment, H1 may be 80 µm to 150 µm, and H2 may be 100 µm to 170 µm.

An upper surface of the second plate 910 may be positioned lower than an upper surface of the circuit board 800.

Meanwhile, the second plate 910 is disposed in the first region S1 of the first plate 900, and thus a thickness T1 in the first region S1 of the first plate 900 is greater than a thickness T2 in the second region S2 of the first plate 900 (T1>T2). That is, the second plate 910 is additionally disposed in the second region S2, and thus T1>T2. Accordingly, the embodiment can improve the operation reliability of the image sensor 810 by improving the flatness of the image sensor 810, and further improve the optical performance of the camera module.

Meanwhile, even if the second plate 910 has a certain thickness, an overall height of the camera module does not increase. This is because the second plate 910 is disposed in the first region S1 of the first plate 900 vertically overlapping the cavity 801 of the circuit board 800.

In addition, since the image sensor 810 is disposed on the upper surface of the second plate 910, a height between the filter 610 and the image sensor 810 can be easily adjusted by adjusting the thickness of the second plate 910, thereby improving operational reliability.

In addition, since the image sensor 810 is disposed on the upper surface of the second plate 910, a length of the wire for electrical connection between the circuit board 800 and the image sensor 810 is shortened, thereby improving reliability of wire bonding.

Meanwhile, a predetermined distance may be spaced between a side surface of the second plate 910 and an inner wall of the circuit board 800. For example, a separation distance D1 between the side surface of the second plate 910 and the inner wall of the circuit board 800 may be 100 µm to 250 µm.

In the first embodiment of the present application, a separate second plate 910 is disposed on the first plate 900 as described above, and the image sensor 810 is attached or fixed on the disposed second plate 910.

Meanwhile, one plate may be etched to provide an integral plate having a protrusion corresponding to the second plate 910 on the one plate. However, in the case of such an integral plate, a size of the integral plate and the circuit board may increase due to an attachment tolerance in a process of attaching the circuit board 800 on the integral plate. For example, the integral plate including the protrusion is used, a tolerances for the position of formation of the protrusion, a tolerance for the size of the cavity 801 of the circuit board 800, a tolerance for the position where the image sensor is mounted on the protrusion, and a tolerance occurring in arranging the protrusions of the integral plate on the circuit board 800 should be considered as a whole, and accordingly, the size of the camera module may increase as a whole.

In contrast, in the embodiment, the circuit board 800 is disposed on the first plate 900, and the second plate 910 is attached to a region of the upper surface of the first plate 900 that vertically overlaps the cavity 801 of the circuit board 800. Accordingly, the embodiment does not have to consider various tolerances of the plate by etching as described above, and thus an overall size of the camera module can be reduced.

FIG. 5 is a plan view showing a circuit board, a first plate, and a second plate in a state in which an image sensor is removed according to a first embodiment.

Referring to FIG. 5, according to the first embodiment, a circuit board 800 includes a cavity 801.

In addition, the first plate 900 is disposed on the lower surface of the circuit board 800.

In this case, the first plate 900 includes a region vertically overlapping the cavity 801 of the circuit board 800. For example, a first region S1 of the first plate 900 may vertically overlap the cavity 801 of the circuit board 800.

A second plate 910 may be disposed in the first region S1 of the first plate 900 vertically overlapping the cavity 801. In this case, an adhesive member (not shown) may be applied between the first plate 900 and the second plate 910. Accordingly, the second plate 910 may be fixed and/or attached to the first plate 900.

An area of the second plate 910 may be smaller than an area of the cavity 801 of the circuit board 800. The area may mean a plane area.

Accordingly, at least a part of the first region S1 of the first plate 900 may not vertically overlap the second plate 910. For example, the first region S1 of the first plate 900 may include an overlapping portion vertically overlapping the second plate 910 and a non-overlapping portion that does not vertically overlap with the second plate 910.

For example, the second plate 910 may be spaced apart from an inner wall of the cavity 801 of the circuit board 800 by a predetermined distance. For example, the second plate 910 may be spaced apart from an inner wall of the cavity 801 of the circuit board 800 by a first distance W1 in a first direction or a width direction. In addition, the second plate 910 may be spaced apart from the inner wall of the cavity 801 of the circuit board 800 by a second distance W2 in a second direction or in a longitudinal direction. In this case, the first distance W1 and the second distance W2 may be the same or different from each other.

Here, the first distance W1 and the second distance W2 may each have a range between 100 μm and 250 μm.

FIG. 6 is a cross-sectional view according to an embodiment of the camera module of FIG. 1 according to a second embodiment.

Referring to FIG. 6, the camera module includes a first plate 900, a second plate 910A, a circuit board 800, an image sensor 810, a first adhesive member 1750, and a second adhesive member 1700.

The second plate 910 of the first embodiment has an area smaller than that of the cavity 801 of the circuit board 800. Accordingly, the cavity 801 of the circuit board 800 of the first embodiment includes an overlapping region that vertically overlaps the second plate 910 and a non-overlapping region that does not vertically overlap the second plate 910.

For example, the second plate 910 of the first embodiment is spaced apart from the inner wall of the circuit board 800 by a predetermined distance.

Alternatively, an area of the second plate 910A of the second embodiment may be the same as an area of the cavity 801 of the circuit board 800. For example, an outer side surface of the second plate 910A may directly contact an inner wall of the cavity 801 of the circuit board 800.

This is, in the present application, the first plate 900 and the second plate 910A are mutually adhered to each other as separate components. Accordingly, the embodiment does not need to consider a tolerance for alignment between the cavity 801 of the circuit board 800 and the second plate 910A when the plate and the circuit board are coupled. Through this, the embodiment may make the area of the cavity 801 and the area of the second plate 910A the same.

FIG. 7 is an exploded perspective view of a camera module according to a third embodiment, FIG. 8 is a cross-sectional view of the camera module of FIG. 7 according to an embodiment, and FIG. 9 is an enlarged view of a dotted line portion of FIG. 8.

The camera module including FIGS. 7 to 9 has a difference in a shape of a second plate 920 compared to the camera module shown in FIGS. 2 to 4, and accordingly, hereinafter, the second plate 920 will be described in detail with reference to FIGS. 7 to 9.

That is, the second plates of the first and second embodiments have a plate-like member, and accordingly, the first adhesive member 1750 is disposed on the upper surface of the second plate, and the image sensor 810 is attached or fixed on the adhesive member 1750. Accordingly, the lower surfaces of the image sensors 810 of the first and second embodiments have a structure in direct contact only with the first adhesive member 1750.

Alternatively, in the third embodiment, a part of the lower surface of the image sensor 810 may contact the second plate 920 and another part of the lower surface of the image sensor 810 may contact the first adhesive member 1750. Accordingly, the third embodiment can further improve a flatness of the image sensor 810. Furthermore, the third embodiment can efficiently dissipate heat generated from the image sensor 810.

To this end, the second plate 920 is disposed on the first region 51 of the first plate 900. In addition, the second plate 920 may include an opening 921 vertically overlapping the first region S1 of the first plate 900. In other words, the opening 921 formed in the center of the plane of the second plate 920 may have a closed loop shape.

Accordingly, the first adhesive member 1750 may be disposed on the upper surface of the first plate 900 instead of the second plate 920. Specifically, the first adhesive member 1750 may be disposed on the first region 51 of the first plate 900 vertically overlapping the opening 921 of the second plate 920. In addition, the second plate 920 may function as a dam to prevent the first adhesive member 1750 from spreading or overflowing. Accordingly, in the third embodiment, it is possible to easily determine the position where the first adhesive member 1750 is applied.

At least a part of the lower surface of the image sensor 810 may directly contact the upper surface of the second plate 920.

For example, a first portion of the lower surface of the image sensor 810 may directly contact the second plate 920 and a second portion of the lower surface of the image sensor 810 may directly contact the first adhesive member 1750. That is, the second portion of the image sensor 810 may be attached or fixed to the first adhesive member 1750 while the first portion is supported by the second plate 920. For example, a first portion of the lower surface of the image sensor 810 may vertically overlap the second plate 920. In addition, the second portion of the lower surface of the image sensor 810 may vertically overlap the first adhesive member 1750.

Accordingly, in the embodiment, the first portion of the lower surface of the image sensor 810 directly contacts the second plate 920, so that the warpage phenomenon of the image sensor 810 may be further improved. In addition, in the embodiment, at least a part of the image sensor 810 directly contacts the second plate 920 to further improve heat dissipation properties of the image sensor 810.

Accordingly, the area of the image sensor 810 in the embodiment may be larger than that of the first adhesive member 1750. That is, only a portion of the lower surface of the image sensor 810 may contact the first adhesive member 1750. That is, in the third embodiment, the first portion of the lower surface of the image sensor 810 may be in contact with the second plate 920, and the second portion other than the first portion may be in contact with the first adhesive member 1750.

Accordingly, the area of the upper surface of the second plate 920 may be smaller than the area of the lower surface of the image sensor 810.

Meanwhile, the first region S1 of the first plate 900 may include a first-first region S1-1 in which the first adhesive member 1750 is disposed and a first-second region S1-2 in which the second plate 920 is disposed. That is, the first region S1-1 of the first region S1 of the first plate 900 overlaps the opening 921 of the second plate 920 in the optical axis direction. For example, the first region S1-1 of the first plate 900 may vertically overlap the first adhesive member 1750. For example, the first-second region S1-2 of the first plate 900 may vertically overlap the second plate 920. In addition, the first plate 900 may include a region that vertically overlaps the cavity 801 and does not vertically overlap the second plate 920 and the first adhesive member 1750.

Hereinafter, structures and arrangement relationships of the first plate 900, the second plate 920, the first adhesive member 1750, and the image sensor 810 according to the third embodiment will be described in detail.

FIG. 10 is a plan view showing a circuit board, a plate, and a first adhesive member in a state in which an image sensor is removed according to a third embodiment, FIG. 11 is a view showing a degree of warpage according to an arrangement area of an adhesive member, and FIG. 12 is a view for explaining a disposition relationship between a protruding part of a plate and an image sensor according to a third embodiment.

Referring to FIGS. 10 to 12, the first plate 900 includes a first region S1 and a second region S2.

In addition, the first region S1 of the first plate 900 may vertically overlap the cavity 801 of the circuit board 800. The first region S1 may be a region in which the image sensor 810 is disposed in the cavity 801 of the circuit board 800, and the second region S2 may be a region where the circuit board 800 is disposed.

Specifically, the first region 51 of the first plate 900 may include a first-first region S1-1 in which the first adhesive member 1750 is disposed and a first-second region S1-2 in which the second plate 920 is disposed. The first-second region S1-2 may be a region surrounding the first-first region S1-1.

The first region S1 may correspond to a shape of the image sensor 810. For example, the first region S1 may have a rectangular shape corresponding to the shape of the image sensor 810, but is not limited thereto.

A second plate 920 including an opening 921 vertically overlapping with the first region S1-2 may be disposed in the first-second region S1-2. The first-second region S1-2 may overlap a corner region of the lower surface of the image sensor 810 in an optical axis direction or vertically among the first region S1. Accordingly, the first-second region S1-2 may be a region overlapping a corner region of the lower surface of the image sensor 810 in an optical axis direction or a vertical direction.

A first adhesive member 1750 may be disposed in the first-first region S1-1. For example, a first adhesive member 1750 may be disposed in a region of the first region S1 vertically overlapping the opening 921 of the second plate 920. The first adhesive member 1750 may not be disposed in the first-second region S1-2. For example, the first adhesive member 1750 may not vertically overlap the second plate 920.

In the embodiment, the image sensor 810 is attached or fixed on the first plate 900 through the first adhesive member 1750 in a state in which the edge region of the lower surface of the image sensor 810 is supported through the second plate 920 as described above.

For example, in the comparative example, a first adhesive member was formed on the plate, and thus the image sensor was attached to the first adhesive member. Specifically, in the comparative example, the first adhesive member was applied to an entire region overlapping the image sensor in the optical axis direction.

Alternatively, in the embodiment, the first adhesive member 1750 may be formed only on a part of the lower surface of the image sensor 810. Accordingly, the area of the lower surface of the image sensor 810 in the embodiment may be greater than the area of the upper surface of the first adhesive member 1750. For example, an area of an upper surface of the first adhesive member 1750 may be less than 95% of an area of a lower surface of the image sensor 810. For example, an area of an upper surface of the first adhesive member 1750 may be 80% or less of an area of a lower surface of the image sensor 810. For example, an area of an upper surface of the first adhesive member 1750 may be 70% or less of an area of a lower surface of the image sensor 810. For example, an area of an upper surface of the first adhesive member 1750 may be 60% or less of an area of a lower surface of the image sensor 810. For example, an area of an upper surface of the first adhesive member 1750 may be 50% or less of an area of a lower surface of the image sensor 810.

Preferably, the area of the upper surface of the first adhesive member 1750 is less than 50% of the area of the lower surface of the image sensor 810. According to this, the embodiment reduces the arrangement area of the first adhesive member 1750 compared to the area of the image sensor 810, and accordingly, a warpage phenomenon that increases in proportion to the area of the first adhesive member 1750 can be minimized.

However, the area of the upper surface of the first adhesive member 1750 exceeds 40% of the area of the lower surface of the image sensor 810. For example, when the area of the upper surface of the first adhesive member 1750 is less than 40% of the area of the lower surface of the image sensor 810, an adhesiveness of the image sensor 810 is lowered, and a physical reliability problem in which the image sensor 810 is separated from various factors may occur.

That is, referring to FIG. 11, if the degree of warpage of the image sensor 810 when the area of the first adhesive member 1750 is 75% or more of the area of the lower surface of the image sensor 810 is 100%, when the area of the first adhesive member 1750 is 50% of the area of the lower surface of the image sensor 810, the degree of warpage of the image sensor 810 is 88%.

In other words, it can be seen that as the area of the first adhesive member 1750 in contact with the image sensor 810 decreases, the effect of the coefficient of thermal expansion decreases and the degree of warpage decreases. Accordingly, in the embodiment, the area of the portion of the image sensor in contact with the first adhesive member 1750 is less than 95% compared to a total area of the lower surface of the image sensor 810, thereby minimizing the occurrence of warping of the image sensor 810.

However, when the contact area between the first adhesive member 1750 and the image sensor 810 is reduced without any reference, a problem in which the adhesive strength decreases and the image sensor 810 is separated from the plate 900 may occur accordingly. In addition, a contact area between the first adhesive member 1750 and the image sensor 810 needs to consider various factors such as wire bonding overhang. Therefore, the area of the upper surface of the first adhesive member 1750 compared to the area of the lower surface of the image sensor 810 is set to have a range of 40% to 90%.

As described above, in the embodiment, only a part of the lower surface of the image sensor 810 is in contact with or vertically overlaps with the first adhesive member 1750, it is possible to minimize the occurrence of warpage of the image sensor 810 and thereby improve the performance of the image sensor.

Meanwhile, the first adhesive member 1750 may be formed on a first region S1-1 of the first region S1 of the first plate 900. For example, the first adhesive member 1750 may be formed in the remaining regions of the first region S1 of the plate 900 except for corner regions. For example, the first adhesive member 1750 may have a shape corresponding to the opening 921 of the second plate 920.

The second plate 920 may be formed on a first-second region S1-2 of the first region S1 of the first plate 900. For example, the second plate 920 may have an opening 921 that vertically overlaps the first region S1-1 of the first plate 900.

Accordingly, the second plate 920 may vertically overlap an edge region of the first region S1 while not vertically overlapping the central region of the first region S1 of the first plate 900.

The second plate 920 may be spaced apart from an inner wall of the cavity 801 of the circuit board 800 by a predetermined distance. For example, the second plate 920 may be spaced apart from an inner wall of the cavity 801 of the circuit board 800 by a first distance W1a in a first direction. In addition, the second plate 920 may be spaced apart from the inner wall of the cavity 801 of the circuit board 800 by a second distance W2a in the second direction. In this case, the first distance W1a and the second distance W2a may be the same or different from each other.

The second plate 920 may overlap a specific region of the image sensor 810 in an optical axis direction or a vertical direction.

For example, the image sensor 810 may include a pixel region composed of a plurality of pixels for detecting a light image (image information) incident through a lens, and a passivation region 812 other than the pixel region.

In this case, the second plate 920 may vertically overlap at least a portion of the pixel region 810. For example, the second plate 920 may vertically overlap a corner region of the pixel region 810.

For example, the second plate 920 may be formed in one region of the first region S1 of the first plate 900 overlapping a corner region of the pixel region of the image sensor 810 in the optical axis direction OA or the vertical direction.

Specifically, the pixel region of the image sensor 810 may include an active pixel region 811-1 used to sense actual image information and a dummy pixel region 811-2 other than the active pixel region 811-1. The active pixel region 811-1 may be used to generate image information using incident light. The dummy pixel region 811-2 is not used to generate image information, but may have the same structure as the active pixel region 811-1. That is, the image sensor 810 includes a dummy pixel region 811-2 between the active pixel region 811-1 generating actual image information and the passivation region 812 for protection thereof in order to increase reliability in generating image information.

In addition, the second plate 920 according to the embodiment may overlap at least a portion of the active pixel region 811-1 of the image sensor in an optical axis direction or a vertical direction. For example, the second plate 920 may vertically overlap a corner region of the active pixel region 811-1. That is, a most important region of the image sensor 810 is the active pixel region 811-1, and a flatness of the active pixel region 811-1 substantially determines performance and operational reliability of the image sensor 810.

In addition, the second plate 920 overlaps at least a portion (or a corner region) of the active pixel region 811-1 in an optical axis direction or a vertical direction. Accordingly, in the embodiment, at least a part of the active pixel region 811-1 of the lower surface of the image sensor 810 can be supported by the second plate 920. Accordingly, according to the embodiment, warping of the active pixel region 811-1 of the image sensor 810 can be minimized, and thus the performance of the image sensor 810 can be further improved.

That is, when the second plate 920 overlaps at least a portion of the active pixel region 811-1 in the optical axis direction or a vertical direction, overall flatness of the active pixel region 811-1 may be maintained. Accordingly, a warpage phenomenon of the image sensor 810 may be minimized.

Meanwhile, although it has been described in FIG. 9 that the outer surface of the second plate 920 is spaced apart from the inner wall of the cavity 801 of the circuit board 800 by a predetermined distance, but is not limited thereto. Specifically, the outer surface of the second plate 920 may directly contact the inner wall of the cavity 801 of the circuit board 800 as in the second embodiment.

FIG. 13 is a perspective view of a portable terminal 200A according to an embodiment, and FIG. 14 is a block diagram of the portable terminal shown in FIG. 13.

Referring to FIGS. 13 and 14, the portable terminal (200A, hereinafter referred to as "terminal") may include a body 850, a wireless communication unit 710, an A/V input unit 720, and a sensing unit 740, an input/output unit 750, a memory unit 760, an interface unit 770, a control unit 780, and a power supply unit 790.

The body 850 shown in FIG. 13 is in the form of a bar, but is not limited thereto, and there may be various structures such as a slide type, a folder type, a swing type, a swivel type, in which two or more sub-bodies are coupled to be movable relative to each other.

The body 850 may include a case (casing, housing, cover, etc.) forming an exterior. For example, the body 850 may be divided into a front case 851 and a rear case 852. Various electronic components of the terminal may be embedded in a space formed between the front case 851 and the rear case 852.

The wireless communication unit 710 may include one or more modules that enable wireless communication between the terminal 200A and the wireless communication system or between the terminal 200A and the network in which the terminal 200A is located. For example, the wireless communication unit 710 may include a broadcast reception module 711, a mobile communication module 712, a wireless internet module 713, a short-range communication module 714, and a location information module 715.

The A/V (Audio/Video) input unit 720 is for inputting an audio signal or a video signal, and may include a camera 721 and a microphone 722 and the like.

The camera 721 may include a camera module according to the embodiment shown in FIG. 3.

The sensing unit may detect a current state of the terminal 200A, such as an opening/closing state of the terminal 200A, a position of the terminal 200A, a presence or absence of user contact, an orientation of the terminal 200A, acceleration/deceleration of the terminal 200A, etc. and generate a sensing signal for controlling the operation of the terminal 200A. For example, when the terminal 200A is in the form of a slide phone, it is possible to sense whether the slide phone is opened or closed. In addition, it is responsible for sensing functions related to whether the power supply unit 790 is supplied with power, whether the interface unit 770 is coupled to an external device, and the like.

The input/output unit 750 is for generating input or output related to sight, hearing, or touch. The input/output unit 750 may generate input data for operation control of the terminal 200A, and may also display information processed by the terminal 200A.

The input/output unit 750 may include a keypad unit 730, a display module 751, a sound output module 752, and a touch screen panel 753. The keypad unit 730 may generate input data in response to a keypad input.

The display module 751 may include a plurality of pixels whose color changes according to an electrical signal. For example, the display module 751 may include at least of a liquid crystal display, a thin film transistor-liquid crystal display, an organic light-emitting diode, a flexible display, three-dimensional display (3D display).

The sound output module 752 may output audio data received from the wireless communication unit 710 in a call signal reception, a call mode, a recording mode, a voice recognition mode, or a broadcast reception mode, or the like; or audio data stored in the memory unit 760.

The touch screen panel 753 may convert a change in capacitance generated due to a user's touch on a specific region of the touch screen into an electrical input signal.

The memory unit 760 may store a program for processing and control of the controller 780, and may temporarily store input/output data (eg, phone book, message, audio, still image, photo, video, etc.). For example, the memory unit 760 may store an image captured by the camera 721, for example, a photo or a moving picture.

The interface unit 770 serves as a passage for connecting with an external device connected to the terminal 200A. The interface unit 770 receives data from an external device, receives power and transmits it to each component inside the terminal 200A, or transmits data of the terminal 200A to an external device. For example, the interface unit 770 may include a wired/wireless headset port, an external charger port, a wired/wireless data port, a memory card port, a port for connecting a device having an identification module, and an audio I/O (Input/Output) port, video I/O (Input/Output) port, and an earphone port, and the like.

The controller (controller, 780) may control the overall operation of the terminal 200A. For example, the controller 780 may perform related control and processing for voice calls, data communications, video calls, and the like.

The controller 780 may include a multimedia module 781 for playing multimedia. The multimedia module 781 may be implemented within the controller 180 or may be implemented separately from the controller 780.

The controller 780 may perform a pattern recognition process capable of recognizing a handwriting input or a drawing input performed on the touch screen as characters and images, respectively.

The power supply unit 790 may receive external power or internal power under the control of the control unit 780 to supply power required for the operation of each component.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

The invention claimed is:

1. A camera module comprising:
a circuit board including a cavity;
a first plate including a first region vertically overlapping the cavity and a second region other than the first region;
a second plate disposed on the first region of the first plate and including an opening vertically overlapping at least a part of the cavity;
a first adhesive member disposed on the first region of the first plate and disposed in the opening of the second plate; and
an image sensor disposed on the second plate through the first adhesive member,
wherein a lower surface of the image sensor includes a first portion in direct contact with the first adhesive member and a second portion in direct contact with the second plate.

2. The camera module of claim 1, wherein the second plate is disposed surrounding an outer side of the first adhesive member.

3. The camera module of claim 2, wherein the first region of the first plate includes:
a first-first region where the first adhesive member is disposed; and
a first-second region in which the second plate is disposed, and
wherein the opening of the second plate vertically overlaps the first-first region.

4. The camera module of claim 3, wherein an upper surface of the second plate is positioned on the same plane as an upper surface of the first adhesive member.

5. The camera module of claim 3, wherein an area of an upper surface of the first adhesive member is smaller than an area of a lower surface of the image sensor.

6. The camera module of claim 3, wherein the second plate vertically overlaps an outer region of a lower surface of the image sensor.

7. The camera module of claim 1, wherein an outer side surface of the second plate is spaced apart from an inner wall of the cavity of the circuit board.

8. The camera module of claim 1, wherein an outer side surface of the second plate directly contacts an inner wall of the cavity of the circuit board.

9. The camera module of claim 3, wherein the image sensor includes a pixel region including an active pixel region and a dummy pixel region, and a passivation region around the dummy pixel region, and
wherein an upper surface of the second plate vertically overlaps a corner region of a lower surface of the active pixel region.

10. The camera module of claim 5, wherein the area of the upper surface of the first adhesive member has a range of 50% to 90% of the area of the lower surface of the image sensor.

11. The camera module of claim 1, wherein the second plate has a closed loop shape including the opening.

12. The camera module of claim 1, further comprising a second adhesive member disposed between the first plate and the second plate.

13. The camera module of claim 1, further comprising:
a lens barrel;
a holder disposed on the circuit board and including a seating part on which a filter is seated; and
a cover member disposed on the circuit board and accommodating the holder and the lens barrel.

14. The camera module of claim 13, wherein the holder includes a gas vent hole passing through an inner surface and an outer surface of the holder.

15. The camera module of claim 3, wherein the first adhesive member is in direct contact with an upper surface of the first plate that vertically overlaps the opening of the second plate.

16. A camera module comprising:
a first plate;
a circuit board disposed on the first plate and including a cavity;
a second plate disposed on a first region of the first plate vertically overlapping the cavity of the circuit board and including an opening;

a first adhesive member disposed on the first region of the first plate and disposed in the opening of the second plate;

an image sensor disposed on the first adhesive member and the second plate;

wherein a portion of the second plate is disposed in the cavity of the circuit board and overlaps the circuit board along a horizontal direction, and wherein the first adhesive member is in direct contact with an upper surface of the first plate that vertically overlaps the opening of the second plate.

17. The camera module of claim 16, wherein the first region of the first plate includes:

a first-first region vertically overlapping the first adhesive member; and a first-second region vertically overlapping the second plate, and wherein the opening of the second plate vertically overlaps the first-first region.

18. The camera module of claim 16, wherein a lower surface of the image sensor includes a first portion in direct contact with the first adhesive member and a second portion in direct contact with the second plate.

19. The camera module of claim 17, wherein an upper surface of the second plate is positioned on the same plane as an upper surface of the first adhesive member.

20. The camera module of claim 16, wherein an area of an upper surface of the first adhesive member has a range of 50% to 90% of an area of a lower surface of the image sensor.

* * * * *